United States Patent
Bol

(10) Patent No.: US 6,541,820 B1
(45) Date of Patent: Apr. 1, 2003

(54) LOW VOLTAGE PLANAR POWER MOSFET WITH SERPENTINE GATE PATTERN

(75) Inventor: Igor Bol, Sherman Oaks, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/536,903

(22) Filed: Mar. 28, 2000

(51) Int. Cl.⁷ .............................................. H01L 29/76
(52) U.S. Cl. .................... 257/341; 257/342; 257/343; 257/344; 257/355; 257/365
(58) Field of Search ................ 257/408, 341, 257/343, 344, 357, 358, 359, 360, 363, 342, 409, 355, 365, 401; 438/305

(56) References Cited

U.S. PATENT DOCUMENTS

| | | | | | |
|---|---|---|---|---|---|
| 3,414,781 | A | * | 12/1968 | Dill ............................ | 257/401 |
| 4,152,717 | A | * | 5/1979 | Satou et al. ................. | 257/373 |
| 4,181,542 | A | * | 1/1980 | Yoshida et al. ............. | 438/193 |
| 4,408,384 | A | * | 10/1983 | Lowis et al. ................. | 438/274 |
| 4,462,041 | A | * | 7/1984 | Glenn .......................... | 257/401 |
| 4,725,747 | A | * | 2/1988 | Stein et al. .................. | 327/389 |
| 4,808,861 | A | * | 2/1989 | Ehni ............................ | 327/389 |
| 5,061,649 | A | * | 10/1991 | Takenouchi et al. ........ | 438/305 |
| 5,191,396 | A | * | 3/1993 | Lidow et al. ................ | 257/339 |
| 5,338,961 | A | * | 8/1994 | Lidow et al. ................ | 257/342 |
| 5,598,018 | A | * | 1/1997 | Lidow et al. ................ | 257/342 |
| 5,742,087 | A | * | 4/1998 | Lidow et al. ................ | 257/342 |
| 5,757,046 | A | * | 5/1998 | Fujihira et al. ............. | 257/339 |
| 5,773,863 | A | * | 6/1998 | Burr et al. ................... | 257/344 |
| 5,780,912 | A | * | 7/1998 | Burr et al. ................... | 257/408 |
| 5,856,693 | A | * | 1/1999 | Onishi ......................... | 257/336 |
| 5,869,378 | A | * | 2/1999 | Michael ...................... | 438/305 |
| 5,955,763 | A | * | 9/1999 | Lin .............................. | 257/355 |
| 5,990,504 | A | * | 11/1999 | Morifuji ...................... | 257/270 |
| 6,002,156 | A | * | 12/1999 | Lin .............................. | 257/356 |
| 6,124,177 | A | * | 9/2000 | Lin et al. .................... | 438/305 |
| 6,274,896 | B1 | * | 8/2001 | Gibson et al. .............. | 257/259 |
| 6,388,292 | B1 | * | 5/2002 | Lin .............................. | 257/356 |
| 2001/0012663 | A1 | * | 8/2001 | Magri' et al. ............... | 438/267 |

OTHER PUBLICATIONS

Kang et al., "CMOS Digital Integrated Circuits—Analysis and Design", WCB/McGraw Hill, 2nd ed., 1999, pp. 29–36.*

* cited by examiner

*Primary Examiner*—Eddie Lee
*Assistant Examiner*—José R. Díaz
(74) *Attorney, Agent, or Firm*—Ostrolenk, Faber, Gerb & Soffen, LLP

(57) ABSTRACT

A three mask process is described for a low voltage, low on-resistance power MOSFET. A serpentine gate divides a non-epi silicon die into laterally separated drain and source regions with a very large channel width per unit area.

7 Claims, 3 Drawing Sheets

US 6,541,820 B1

LOW VOLTAGE PLANAR POWER MOSFET WITH SERPENTINE GATE PATTERN

FIELD OF THE INVENTION

This invention relates to MOSgated semiconductor devices, and more specifically relates to a novel process and resulting article for a low voltage very low $V_{ON}$ device made with minimum number of masks.

BACKGROUND OF THE INVENTION

MOSgated devices such as power MOSFETs are well known. The manufacturing process for such devices usually requires a large number of masks and long oxidation and drive steps. Further, such devices usually are vertical conduction devices, requiring a backside metallization and the use of expensive silicon wafers with epitaxial junction-receiving layers.

It would be very desirable to produce a low cost MOSgated device with a simpler process in non-epi, float zone material with a very low $V_{ON}$.

BRIEF DESCRIPTION OF THE INVENTION

In accordance with the invention, a novel process and device are formed, using a laterally interdigitated topology, and using as few as 3 masks in the process.

Thus, the surface of a silicon wafer, in which a plural identical die are formed is first oxidized to form a gate oxide layer and is then covered with a conductive polysilicon gate. A serpentine gate pattern, with reentrant segments, is then defined in a first mask step wherein the areas on opposite sides of the serpentine gate are to become respective and identical source and drain areas.

A light phosphorus dose is then implanted to ultimately define a lightly doped source/drain region. A Lightly Doped Drain (LDD) structure is known to increase drain breakdown voltage and therefore device operational voltage. An LTO (low temperature oxide) layer is then formed and then plasma etched, leaving a side wall spacer about and along the edge of the polysilicon gate. A heavy arsenic implant is next applied to the source/drain areas through this new and narrowed window.

A titanium layer is then deposited atop the wafer surface and is alloyed to form a silicide with the exposed silicon and is etched. Thereafter a low temperature oxide or nitride is deposited atop the wafer. A second mask, which is non-critically aligned with the first is a contact mask to permit selective and spaced gate, drain and source contacts to the wafer/die surface. (Note that the terms "source" and "drain" are interchangeable.)

Thereafter, aluminum is sputtered atop the wafer surface, making contact through the windows in the LTO to the source, drain and gate regions. A non critical aligned contact mask operation is then used to separate the metal contacts to the various electrodes. Selective electroplating can be employed at this step to further increase metal thickness.

The final device will have a very low $R_{DSON}$ (or $V_{ON}$). The process is very simple, requiring only 3 masks and no long oxidation or drive steps. No backside metallization is needed and no epi is required. The wafers are also easy to modularize. It has been found that a finished 5 inch wafer can be produced at a total cost of under about $60.

DETAILED DESCRIPTION OF THE DRAWINGS

Figure 1:
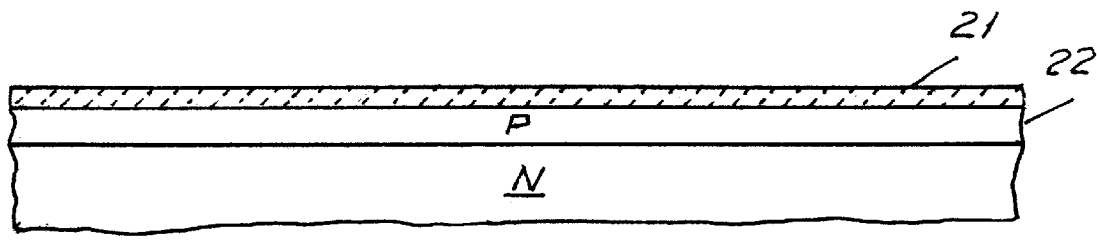
FIG. 1 shows a small portion of a(non-epi) wafer of starting silicon after the deposition of gate oxide and a P type blanket implant.

Referring first to FIG. 1, there is shown a small portion of a silicon wafer 20 which is a thin monocrystaline wafer (non-epitaxial) which may be of the N type. The terms wafer and die are interchangeably used and understood.

The die to be made may be low voltage die, for example, 12 volts, although any desired voltage can be selected by selecting a suitable resistivity for the silicon and a suitable sizing of the gate, drain and source regions. Further, while an N channel device will be described, it will be apparent that a P channel device could also be made.

The first step in the process, shown for a small portion of the wafer, is shown in FIG. 1 and consists of the growth of silicon dioxide layer 21 to a thickness of about 250 Å, followed by a shallow P type boron implant 22 (for example, 0.2 to 0.3 microns deep), at a dose of about 1E12 ions/cm². Other implant species could have been used. Implant 22, as will be later seen, becomes the invertable channel region of the MOSFET.

Figure 2:
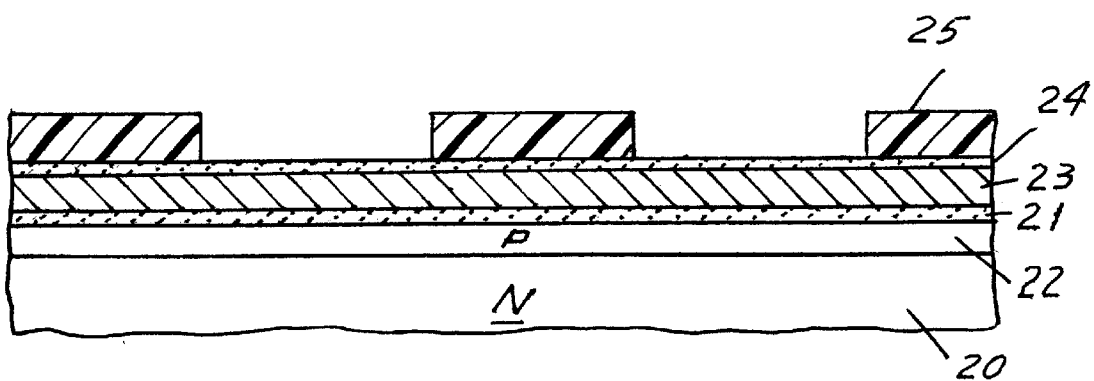
FIG. 2 shows the wafer portion of FIG. 1 after polysilicon deposition and the first mask step.

Thereafter, and as shown in FIG. 2, polysilicon layer 23 is deposited atop gate oxide 21 and is made conductive by conventional treatment with POCl. Thereafter, a thin (1000 Å) layer of polyoxide 24 is grown atop polysilicon 23, and a photoresist 25 is formed over the oxide layer 24. A gate mask having the pattern shown in FIG. 8, with reentrant spaced segments, is then used to pattern the photoresist 25 as shown in FIG. 2.

Figure 3:
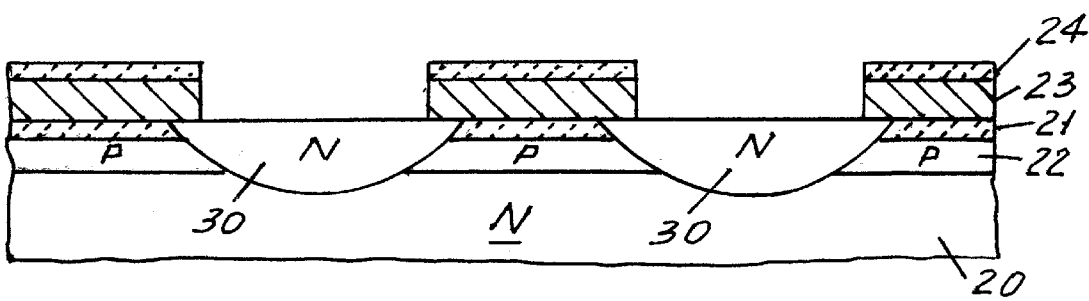
FIG. 3 shows the wafer portion of FIG. 2 after formation of the polysilicon gate and a lightly doped phosphorus (LDD) implant into the source/drain regions of the device.

As next shown in FIG. 3, the oxide layer 24 is etched and the underlying polysilicon 23 is etched to open source/drain implant windows. A plasma etch may be used. A low dose implant of phosphorous, at 5E13 ions/cm² is then carried out to implant a lightly doped region which, when diffused will counterdope the more lightly doped P layer 22 to form spaced N type source/drain regions 30.

Figure 4:
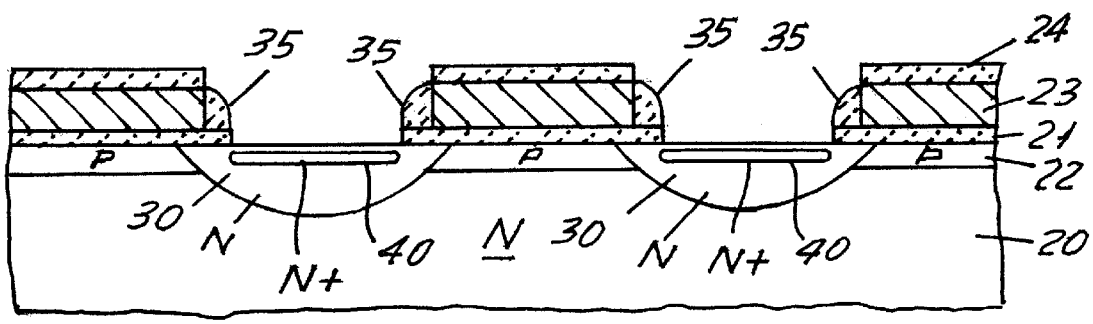
FIG. 4 shows the wafer portion of FIG. 3 after the formation of a side wall spacer and the implant of the heavily doped source/drain area.

As next shown in FIG. 4, a low temperature oxide layer has been deposited over the surface of the wafer and was densified. Thereafter a plasma etch was carried out to remove the horizontal surfaces of the LTO, leaving LTO spacers 35 along the side edges of the polysilicon 23. A high dose (6E15) implant 40 of arsenic is then applied through the window defined by spacers 35. The structure of FIG. 4 defines a channel strip which is preferably reentrantly shaped, as will be shown in FIG. 8, and has a width of about 1.5 microns.

Figure 5:
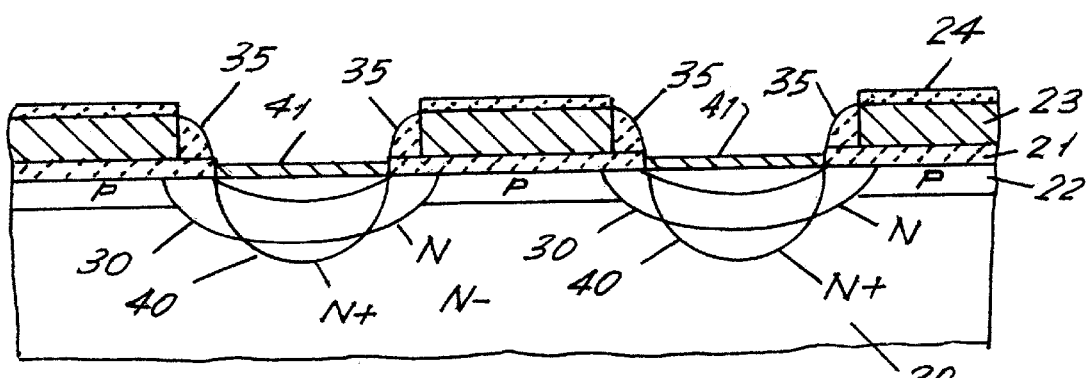
FIG. 5 shows the wafer portion of FIG. 4 after the formation of a metal silicide contact to the source and drain regions.

The arsenic implant 40 is then driven as shown in FIG. 5 to act as a high concentration contact region for the low concentration source/drain regions 30. Titanium is next sputtered atop the full upper surface of the wafer and is alloyed to encourage a silicide formation 41 with the exposed silicon within the windows formed by spacers 35. The titanium atop the spacers 35 and polyoxide 24 is etched away.

Figure 6:
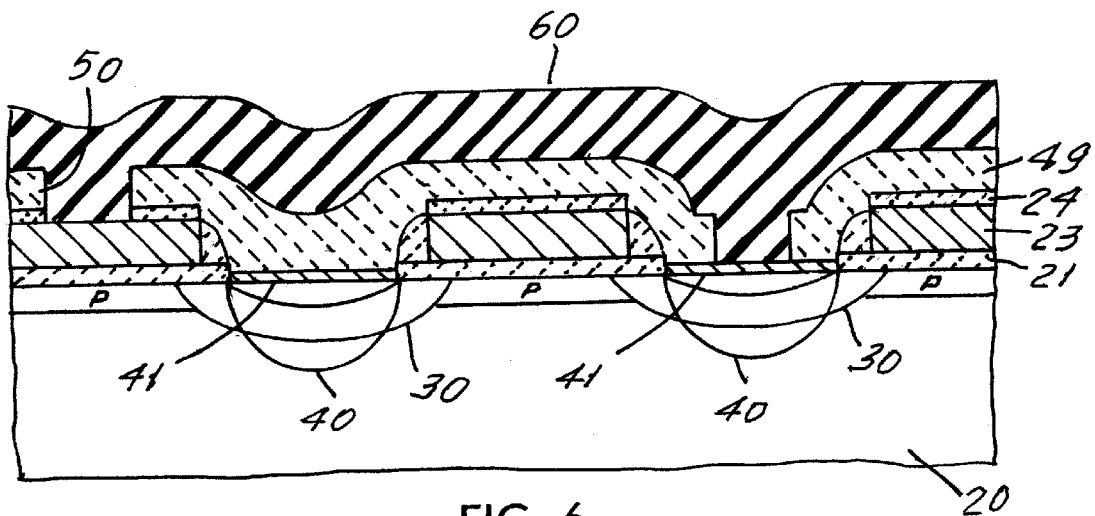
FIG. 6 shows the wafer portion of FIG. 4 after LTO deposition and the second mask step, which is a contact mask.

As next shown in FIG. 6, the top of the wafer is covered with an LTO or an LTN deposited layer 49. A contact mask, not shown, is then applied atop the LTO layer 49 and openings are formed in the LTO to define contact windows such as windows 50 and 51 in FIG. 6 which access the polysilicon gate 23 and source/drain regions 40. A metal barrier and aluminum sputtered layer 60 is applied to the top of the wafer and contacts the polysilicon 23 at spaced locations along their length (into the paper), and also contacts silicide 41 and the regions 30/40 at spaced locations along its length.

Figure 7:
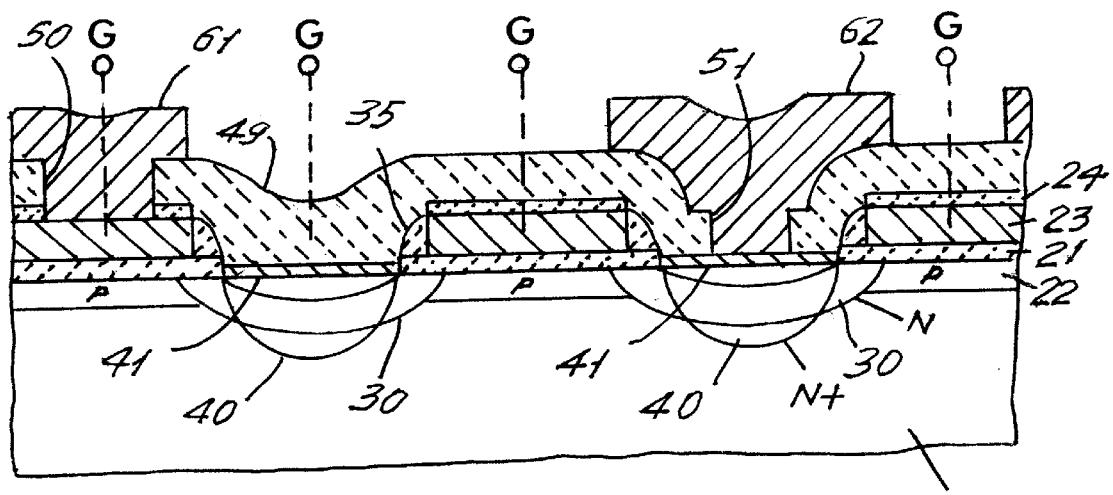
FIG. 7 shows the wafer portion of FIG. 6 after metal deposition and the third mask step, which is a metal mask.

As next shown in FIG. 7, a third mask, which is a metal mask, is then used to separate the aluminum into gate contact connection 61 and source/drain connection 62. Selective metal electroplating can be applied to further increase the metal thickness of metal 60.

Figure 8:
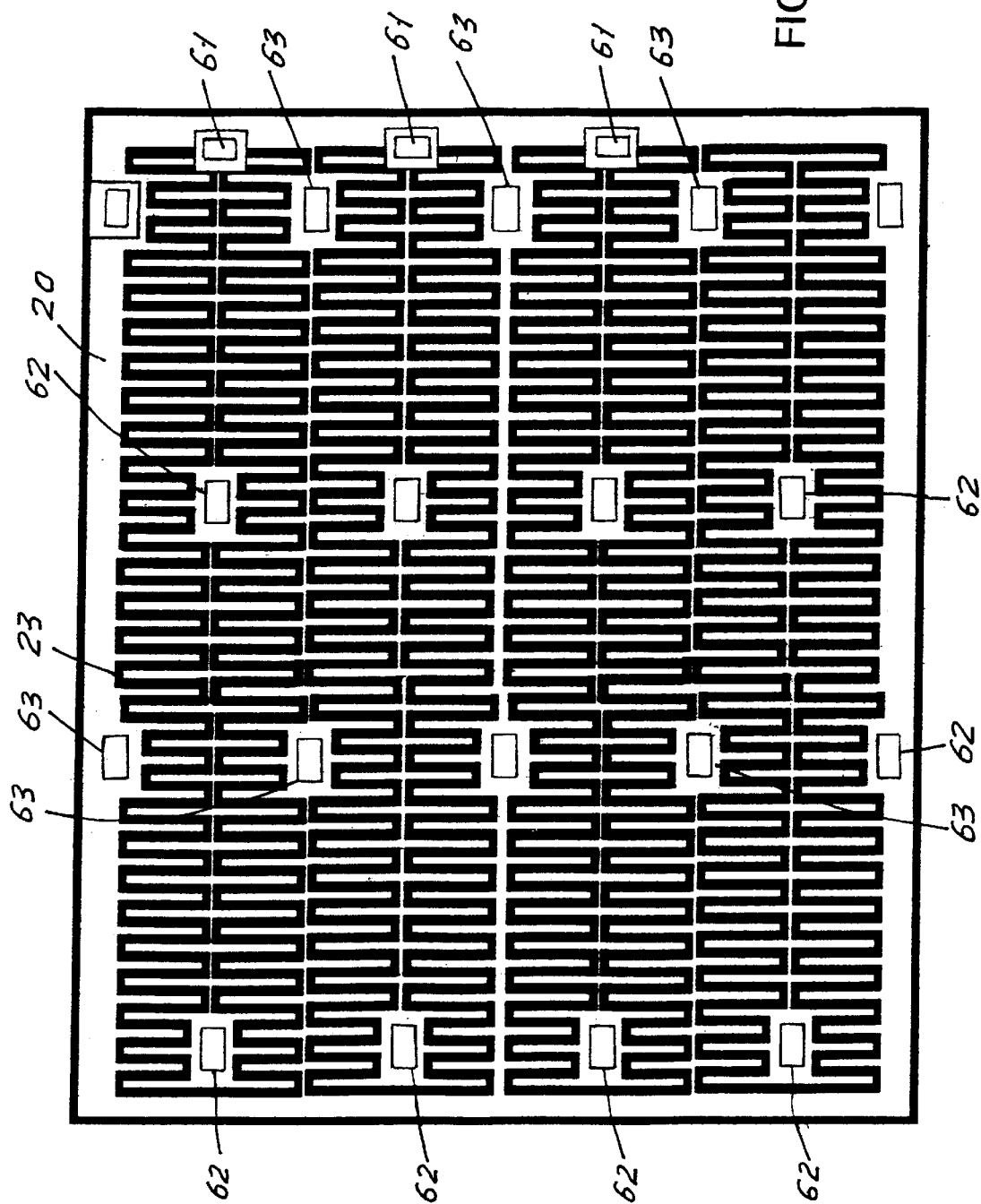
FIG. 8 is a top view of the wafer of FIG. 7, showing a typical serpentine pattern which can be taken for the gate, source and drain regions of the device.

The location of contacts 61 and 62 in FIG. 7 are schematic and their actual positions would be as shown in FIG. 8. FIG. 8 shows a plurality of gate contacts 61. FIG. 8 also shows a plurality of source/drain contacts 62 which can be selectively connected as source 62 or drain 63. Note that source/drain contacts 62 and 63 are aligned in alternate rows and can therefore be easily connected by elongated conductive source and drain fingers. Similarly, the gate contacts 61 are aligned along a single row.

After completion of the process, a large number of die which may be identical to that of FIG. 8 are singulated and may be suitably mounted. Note that no back metal or termination is needed.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power MOSFET comprising:
   a die of monocrystaline silicon having an upper junction receiving surface;
   an elongated strip of gate oxide fixed to said upper surface and overlying a shallow invertible channel region of one conductivity type and a conductive polysilicon gate overlying said strip of gate oxide;
   a first and a second region of the other of said conductivity types disposed on opposite sides of said elongated strip and defining source/drain regions, said first and said second regions extending to a depth below that of said invertible channel;
   said first and second regions each having lightly doped segments disposed beneath said elongated strip and a central more highly doped contact region, whereby said first and second regions are laterally connected together when said invertible channel region is inverted; and
   a plurality of spaced contacts electrically connected to said conductive polysilicon gate, and to said first and second regions,
   wherein said elongated strip follows a serpentine path over said upper surface.

2. The power MOSFET of claim 1, wherein said invertible channel has a depth of about 0.2 to about 0.3 microns.

3. The power MOSFET of claim 2, wherein said elongated strip has a width of about 1.5 microns.

4. The power MOSFET of claim 2, wherein each of said polysilicon gate and first and second regions receive a respective plurality of spaced contacts along their length.

5. The power MOSFET of claim 4, wherein said spaced contacts for said polysilicon gate and said first and second regions are aligned along respective straight lines.

6. The power MOSFET of claim 1, wherein each of said polysilicon gate and first and second regions receive a respective plurality of spaced contacts along their length.

7. The power MOSFET of claim 6, wherein said spaced contacts for said polysilicon gate and said first and second regions are aligned along respective straight lines.

* * * * *